(12) United States Patent
Yeh et al.

(10) Patent No.: US 12,142,245 B2
(45) Date of Patent: Nov. 12, 2024

(54) CONTROL SYSTEM WITH CASCADE DRIVING CIRCUITS AND RELATED DRIVING METHOD

(71) Applicant: NOVATEK Microelectronics Corp., Hsin-Chu (TW)

(72) Inventors: Che-Wei Yeh, Hsinchu (TW); Keko-Chun Liang, Hsinchu (TW); Yu-Hsiang Wang, Hsinchu (TW); Yong-Ren Fang, Kaohsiung (TW); Yi-Chuan Liu, Hsinchu County (TW); Yi-Yang Tsai, Hsinchu County (TW); Po-Hsiang Fang, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 184 days.

(21) Appl. No.: 17/945,082

(22) Filed: Sep. 14, 2022

(65) Prior Publication Data
US 2023/0005451 A1    Jan. 5, 2023

Related U.S. Application Data

(63) Continuation-in-part of application No. 17/363,020, filed on Jun. 30, 2021, now Pat. No. 11,482,293.
(Continued)

(51) Int. Cl.
*G11C 19/28* (2006.01)
*G09G 3/20* (2006.01)
*G09G 5/12* (2006.01)

(52) U.S. Cl.
CPC .............. *G09G 5/12* (2013.01); *G09G 3/20* (2013.01); *G11C 19/28* (2013.01);
(Continued)

(58) Field of Classification Search
CPC .. G11C 19/28; G09G 3/20; G09G 2310/0286; G09G 2310/08; G09G 5/006; G09G 5/12; G09G 5/18
See application file for complete search history.

(56) References Cited

U.S. PATENT DOCUMENTS 7,999,799 B2 *   8/2011   Fukuo ................. G09G 3/3688
                                                                    345/98
10,275,202 B2    4/2019   Jo
(Continued)

FOREIGN PATENT DOCUMENTS

CN        105097043 A       11/2015
CN        105873290 A       8/2016
(Continued)

*Primary Examiner* — Patrick O Neill
(74) *Attorney, Agent, or Firm* — Winston Hsu

(57) ABSTRACT

A control system includes a plurality of driving circuits coupled in series, which include a first driving circuit and a second driving circuit. The first driving circuit includes a first receiver, a first transmitter and a first flag signal selector. The first transmitter is coupled to the first receiver, and the first flag signal selector is coupled between the first receiver and the first transmitter. The second driving circuit, coupled to the first driving circuit, includes a second receiver, a second transmitter and a second flag signal selector. The second transmitter is coupled to the second receiver, and the second flag signal selector is coupled between the second receiver and the second transmitter.

9 Claims, 9 Drawing Sheets

Related U.S. Application Data

(60) Provisional application No. 63/061,811, filed on Aug. 6, 2020.

(52) U.S. Cl.
CPC ............... *G09G 2310/0286* (2013.01); *G09G 2310/0291* (2013.01); *G09G 2310/08* (2013.01)

(56) References Cited

U.S. PATENT DOCUMENTS

| | | |
|---|---|---|
| 11,170,702 B2 | 11/2021 | Yeh |
| 11,482,293 B2 * | 10/2022 | Yeh ........................ G11C 19/28 |
| 2004/0242171 A1 | 12/2004 | Hosokawa |
| 2015/0287390 A1 | 10/2015 | Kakeko |
| 2015/0332787 A1 * | 11/2015 | Lee ...................... G11C 29/023 714/718 |
| 2018/0046424 A1 | 2/2018 | Jo |
| 2021/0049952 A1 | 2/2021 | Yeh |
| 2021/0365230 A1 | 11/2021 | Sul |

FOREIGN PATENT DOCUMENTS

| | | |
|---|---|---|
| JP | 2004-146057 A | 5/2004 |
| TW | 200515350 | 5/2005 |
| TW | 200527359 | 8/2005 |
| TW | I258666 | 7/2006 |
| TW | 201115922 A1 | 5/2011 |

\* cited by examiner

CONTROL SYSTEM WITH CASCADE DRIVING CIRCUITS AND RELATED DRIVING METHOD

CROSS REFERENCE TO RELATED APPLICATIONS

This application is a continuation-in-part application of U.S. application Ser. No. 17/363,020, filed on Jun. 30, 2021, which claims the benefit of U.S. Provisional Application No. 63/061,811, filed on Aug. 6, 2020. The contents of these applications are incorporated herein by reference.

BACKGROUND OF THE INVENTION

1. Field of the Invention

The present invention relates to a control system with cascade driving circuits and a related driving method, and more particularly, to a synchronization technique performed on a control system with cascade driving circuits and a related synchronization method.

2. Description of the Prior Art

As the data quantity to be processed in a control system increases and increases, a multi-chip system may be required. The deployment of multiple chips allows a tremendous amount of data to be processed successfully. In a multi-chip system, the chips may be coupled in series as a cascade structure, where each chip may receive signals from the previous one and forward the signals to the next one. The transmitted signals may be received by each chip in the system to realize a specific purpose, such as driving a panel to emit light or further optimizing the display image. Therefore, due to the high resolution of the modern display system, a single chip may not be enough to deal with the tremendous quantity of display data, and the multi-chip system may be more feasible.

Since the chips are coupled in series, the signals to be processed by a chip may come from its previous chips. Thus, there is a time delay on the signal flow from one chip to another, and a time difference of signal reception arises between different chips. In order to allow the chips to operate normally, processing of the signals should be synchronized. For example, in a display system where the panel is driven by multiple chips, the display data output by different chips should be synchronized with each other. Thus, how to synchronize the operations of the chips in a multi-chip system has become an important issue in this art.

SUMMARY OF THE INVENTION

It is therefore an objective of the present invention to provide a control system composed of cascade chips and a related driving method to perform synchronization between the chips.

An embodiment of the present invention discloses a control system comprising a plurality of driving circuits coupled in series. The plurality of driving circuits comprise a first driving circuit and a second driving circuit. The first driving circuit comprises a first receiver, a first transmitter and a first flag signal selector. The first transmitter is coupled to the first receiver, and the first flag signal selector is coupled between the first receiver and the first transmitter. The second driving circuit, coupled to the first driving circuit, comprises a second receiver, a second transmitter and a second flag signal selector. The second transmitter is coupled to the second receiver, and the second flag signal selector is coupled between the second receiver and the second transmitter.

Another embodiment of the present invention discloses a driving circuit, which comprises a receiver, a transmitter and a flag signal selector. The transmitter is coupled to the receiver. The flag signal selector is coupled between the receiver and the transmitter. Wherein, the flag signal selector comprises a select circuit coupled to output terminals of a plurality of flip-flops.

Another embodiment of the present invention discloses a method of driving a controller for a control system having a plurality of driving circuits coupled in series. The plurality of driving circuits comprise a first driving circuit and a second driving circuit. The method comprises steps of: receiving, by the first driving circuit, a first signal from a previous stage; transmitting, by the first driving circuit, the first signal to the second driving circuit; delaying the first signal to generate a second signal according to a flag signal by performing at least one of the following steps: selecting a first flag signal from a plurality of first flag signals corresponding to different clock cycles in each of the first driving circuit and the second driving circuit; and selecting a second flag signal from a plurality of second flag signals corresponding to different phases in each of the first driving circuit and the second driving circuit; and controlling a timing of outputting the second signal to the controller by using the selected flag signal, to synchronize the second signal output by the first driving circuit and the second driving circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
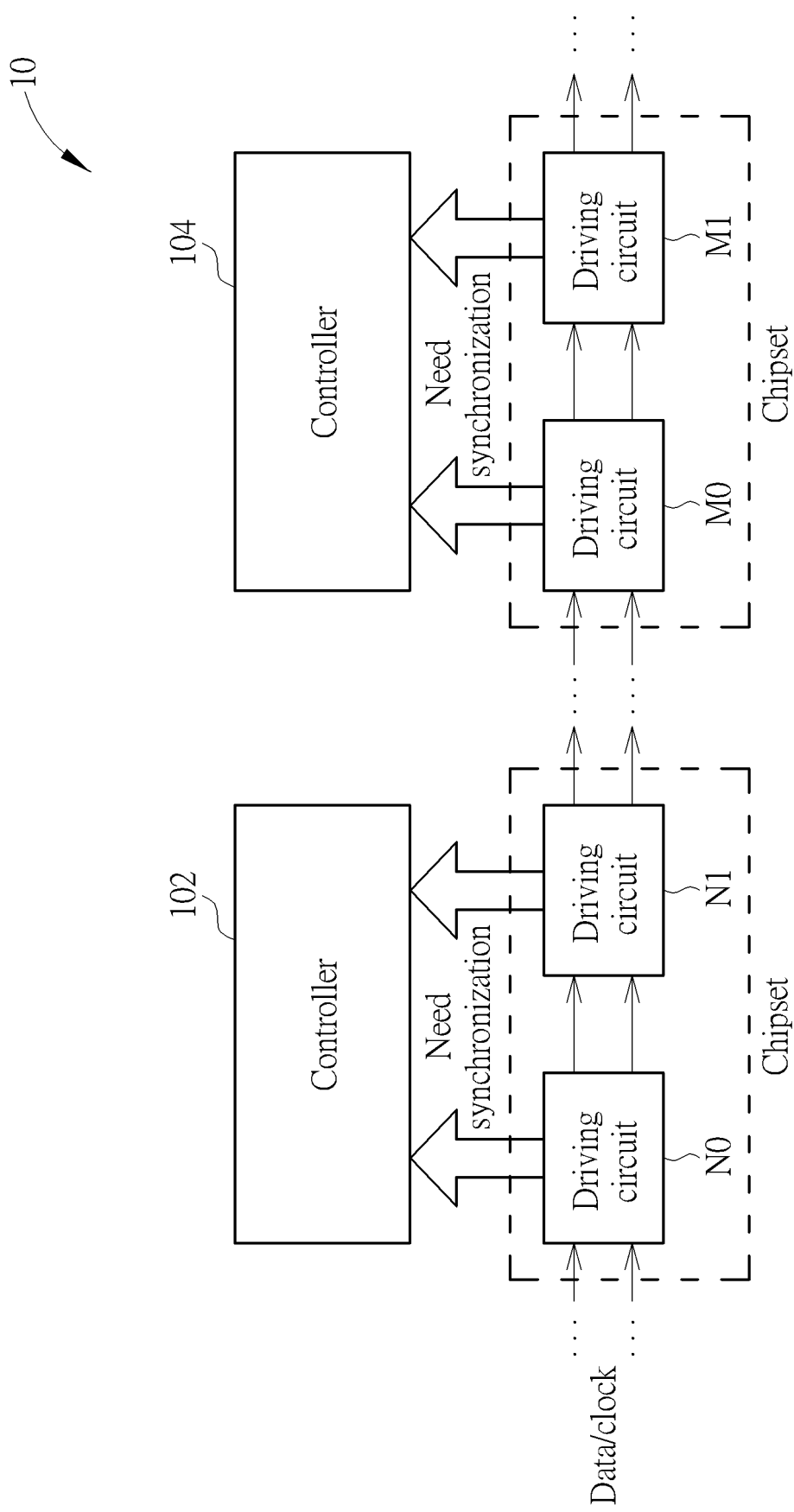
FIG. 1 is a schematic diagram of a control system.

Please refer to FIG. 1, which is a schematic diagram of a control system 10. As shown in FIG. 1, the control system 10 includes controllers 102 and 104, and driving circuits N0, N1, M0 and M1 for controlling the controllers 102 and 104, respectively. In detail, the driving circuits N0 and N1 are used for driving the controller 102 and the driving circuits M0 and M1 are used for driving the controller 104. Each driving circuit may be an integrated circuit (IC) implemented in a chip. Therefore, the driving circuits N0 and N1 may be a chipset configured to control the controller 102, and the driving circuits M0 and M1 maybe a chipset configured to control the controller 104. The controllers 102 and 104 may broadly refer to any type of control circuit being served as a load receiving controls from the driving circuits and/or providing a control function.

In detail, in the control system 10, the driving circuits are coupled in series. A signal source may provide a data or clock signal for each of the driving circuits, and transmit the data or clock signal to the driving circuit in the first stage. This driving circuit then forwards the data or clock signal to the driving circuit in the next stage, and so on. As for each driving circuit, the data or clock signal may be received from the signal source or the driving circuit in the previous stage. In addition, each driving circuit (except for those in the last stage) may transmit the data or clock signal to the next stage.

Therefore, since each controller is controlled by multiple driving circuits, these driving circuits configured to control the same controller need to be synchronized. In other words, the driving signals of the driving circuits sent to the same controller need to be synchronized with each other. In the control system 10, the driving circuits N0 and N1 for controlling the controller 102 need to be synchronized, and the driving circuits M0 and M1 for controlling the controller 104 need to be synchronized.

Please note that the control system 10 as shown in FIG. 1 is merely served to illustrate an exemplary control system where each controller is controlled by two driving circuits. In another embodiment, a controller may be controlled by more than two driving circuits, and/or the control system may include any number of controllers receiving controls from the driving circuits. If a controller is controlled by more than two driving circuits, all of these driving circuits need to be synchronized with each other.

In an embodiment, each of the controllers 102 and 104 may be a light board as a segment of a splicing screen of a display panel such as a liquid crystal display (LCD) panel, a light-emitting diode (LED) display panel, or a micro-LED display panel. Therefore, the data or clock signals forwarded between the driving circuits may include display data and/or control signals for controlling the parameters associated with display image, optical features, sound features, etc. of the display panel. Alternatively, the data or clock signals may be used to generate the display data and/or control signals. However, in the control system 10, the signals are forwarded between the driving circuits stage by stage; hence, there is a timing difference of signal reception between each driving circuit. That is, a driving circuit in the former stage may receive the signals earlier, while a driving circuit in the latter stage may receive the signals later. Therefore, the driving circuits should be synchronized appropriately, so that the driving signals of the driving circuits for controlling the controller and the corresponding display panel will be output with a synchronous timing, allowing the image to be shown correctly.

In another embodiment, the control system 10 may be any other type of electronic system, and should not be limited to the display system described herein. Based on the applications of the controller, if the output signals of multiple driving circuits are cooperated to realize a predetermined function, these output signals should be synchronized. As mentioned above, each driving circuit may be an IC implemented in a chip; hence, the synchronization is performed between chip and chip.

Figure 2:
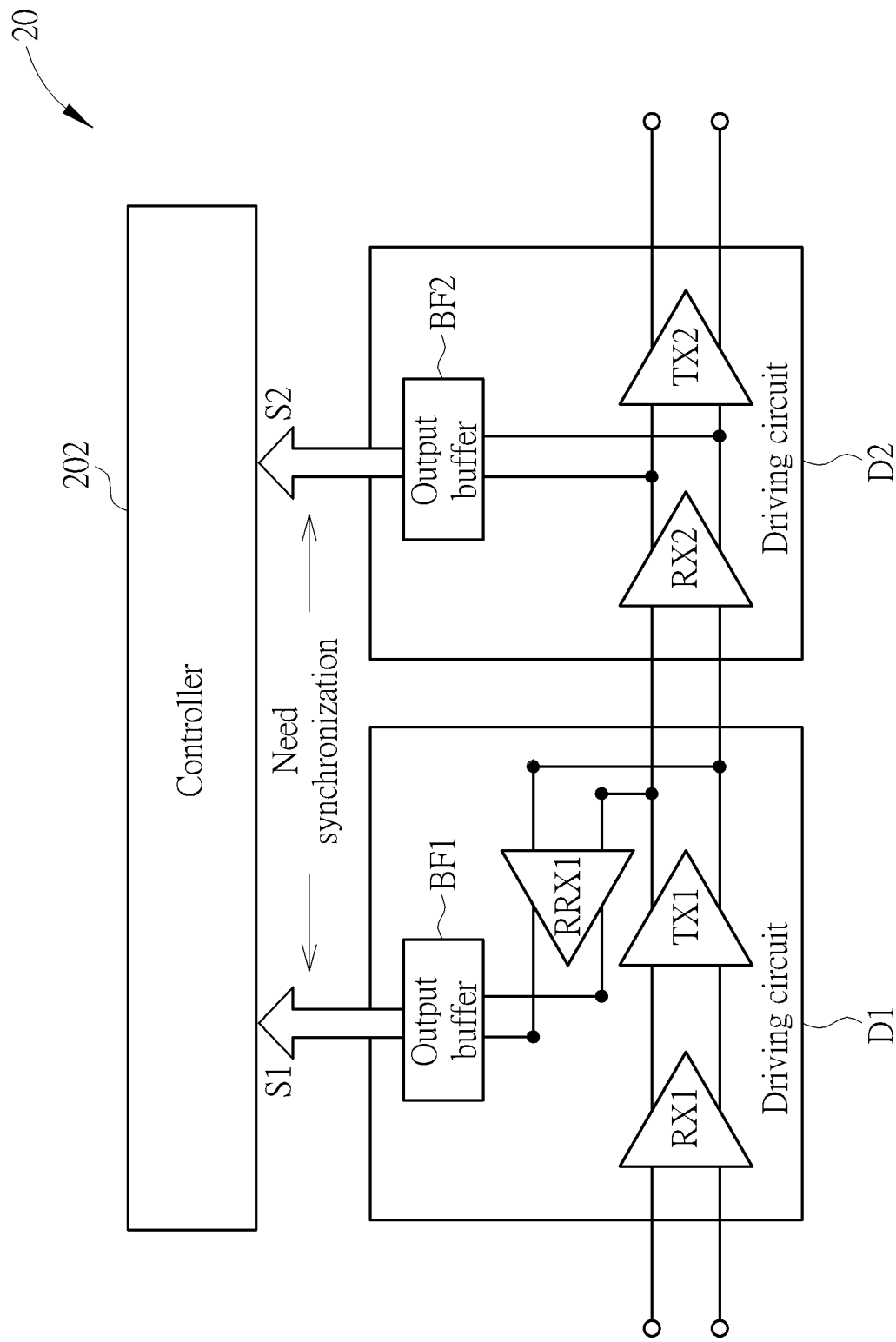
FIG. 2 to FIG. 4 are schematic diagrams of a control system according to an embodiment of the present invention.

In an embodiment, the driving circuits are synchronized using a delay replica scheme. Please refer to FIG. 2, which is a schematic diagram of a control system 20 according to an embodiment of the present invention. As shown in FIG. 2, the control system 20 includes a controller 202 and two driving circuits D1 and D2. The controller 202 may receive driving signals S1 and S2 from the driving circuits D1 and D2, respectively. The driving circuits D1 and D2 may be two of a plurality of driving circuits coupled in series included in the control system 20, where the driving circuit D1 may receive a data or clock signal from the signal source or a driving circuit in the previous stage, and forward the data or clock signal to the driving circuit D2.

In detail, the driving circuit D1 includes a receiver RX1, a transmitter TX1 and an output buffer BF1, and the driving circuit D2 includes a receiver RX2, a transmitter TX2 and an output buffer BF2. The receiver RX2 of the driving circuit D2 is coupled to the transmitter TX1 of the driving circuit D1, allowing the driving circuit D2 to receive the data or clock signal from the driving circuit D1. The receivers RX1 and RX2 may include circuitry capable of receiving signals from the previous stage. The transmitters TX1 and TX2 may include circuitry capable of transmitting signals to the next stage. The output buffers BF1 and BF2 are configured to output the driving signals S1 and S2 to drive the controller 202, respectively, and the output driving signals S1 and S2 need to be synchronized. That is, the timing of the driving circuit D2 outputting the driving signal S2 to the controller 202 is synchronized with the timing of the driving circuit D1 outputting the driving signal S1 to the controller 202. Note that each of the output buffers BF1 and BF2 may be composed of a buffer circuit such as a register, a D flip-flop, or any other type of circuit capable of forwarding the received data or clock signal. Alternatively, the output buffer BF1 or BF2 may include a processing circuit, which may identify and process the data signals to generate the driving signals S1 and S2 for the controller 202 based on the received data signals. In an embodiment, if the controller 202 includes a display panel configured to receive the driving signals S1 and S2 from the driving circuits D1 and D2, each of the output buffers BF1 and BF2 may include a level shifter configured to convert the level of the signals to be compatible with the display panel, and/or include an operational amplifier capable of driving the large panel loading. In another embodiment, the output buffers BF1 and BF2 may be omitted, and the signals from the receiver or replica receiver may be directly output to the controller 202.

In this embodiment, the output buffer BF1 of the driving circuit D1 may output the driving signal S1 by receiving the data or clock signal, and the output buffer BF2 of the driving circuit D2 may output the driving signal S2 by receiving the same data or clock signal. Since the driving circuit D1 is previous to the driving circuit D2, the driving circuit D1 may receive the data or clock signal prior to the driving circuit D2. In order to synchronize the driving signals S1 and S2, the driving circuit D1 may further include a replica receiver RRX1, which is coupled to the output terminal of the transmitter TX1 (and also coupled to the input terminal of the receiver RX2 of the driving circuit D2). The replica receiver RRX1 may have a circuit structure similar to the structure of the receiver RX2, so as to generate a delay time identical to the delay time generated by the receiver RX2. In addition, the replica receiver RRX1 is disposed in the output path of the data or clock signal, e.g., coupled to the output terminal of the transmitter TX1. Therefore, the data or clock signal from the input terminal of the driving circuit D1 may be sent to the output buffer BF1 through the receiver RX1, the transmitter TX1 and the replica receiver RRX1, and the same data or clock signal from the input terminal of the driving circuit D1 may be sent to the output buffer BF2 through the receiver RX1, the transmitter TX1 and receiver RX2, so that the data or clock signal may reach the output buffers BF1 and BF2 at the same time. In addition, the output buffers BF1 and BF2 may have the same circuit structure, allowing the driving signals to be output with well synchronization.

In such a situation, the synchronization may be easily realized without large area and high cost, where only one additional replica receiver is included. Preferably, the circuit structure of the replica receiver RRX1 may be exactly identical to the circuit structure of the receiver RX2. In addition, the process variation between the replica receiver RRX1 and the receiver RX2 may be minimized by using layout techniques. For example, the driving circuit D1 may further include a dummy transmitter coupled to the output terminal of the replica receiver RRX1, where the circuit structure of the dummy transmitter may be identical to the circuit structure of the transmitter TX2 of the driving circuit D2. This allows the output loading of the replica receiver RRX1 to be identical to the output loading of the receiver RX2. As a result, the replica receiver RRX1 and the receiver RX2 may generate almost the same delay time on the signals, allowing the signals to be well synchronized.

Figure 3:
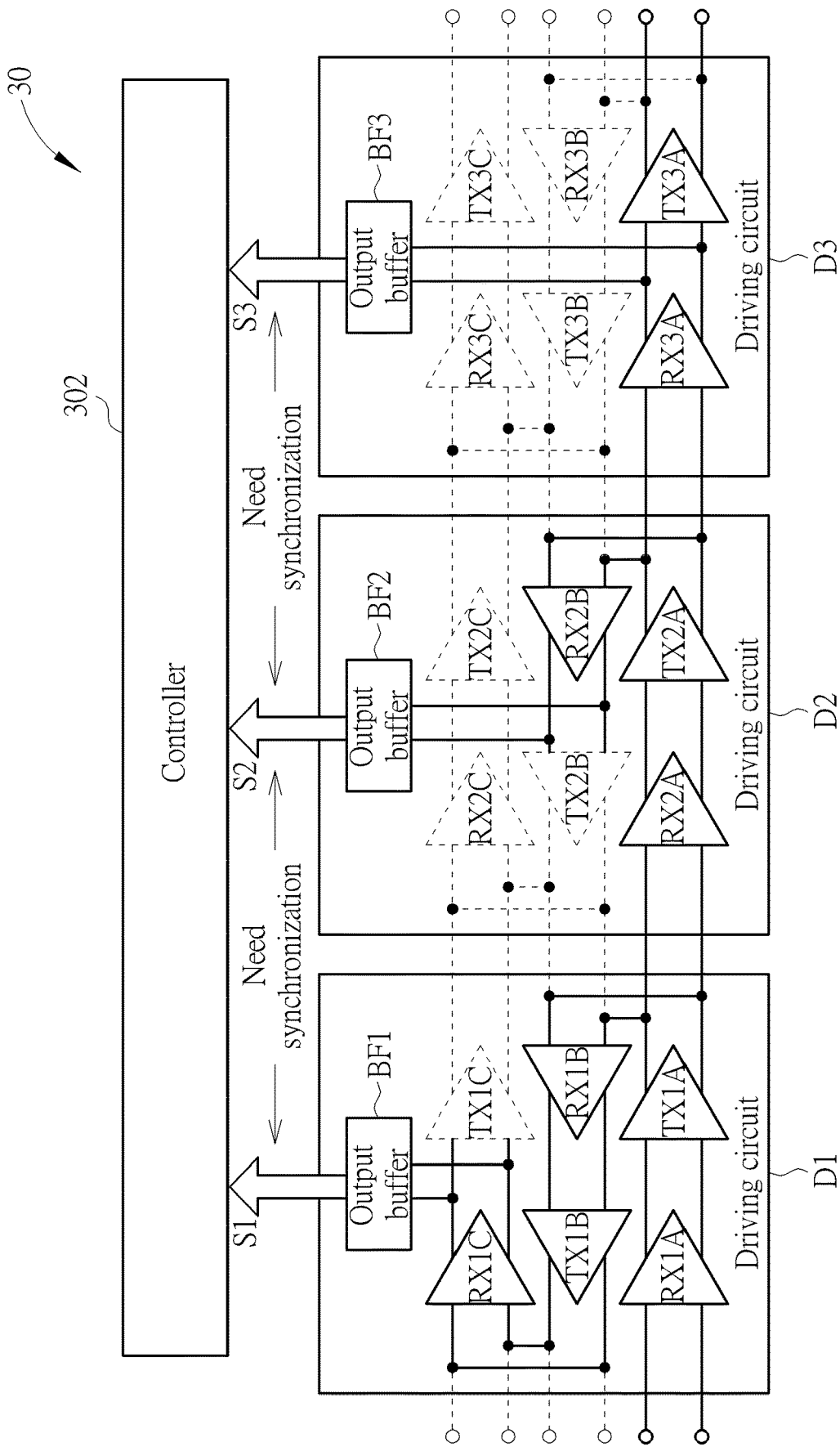

Please note that the delay replica scheme of the present invention may also be applicable to synchronize more than two driving circuits in a control system. Please refer to FIG. 3, which is a schematic diagram of another control system 30 according to an embodiment of the present invention. As shown in FIG. 3, the control system 30 includes a controller 302 and three driving circuits D1-D3. The driving circuits D1-D3 are connected in series, and configured to control the controller 302 by outputting driving signals S1-S3, respectively. The data or clock signal is forwarded from the driving circuit D1 to D2 and D3 in sequence. In order to successfully control the controller 302, the output driving signals S1-S3 need to be synchronized with each other.

Similarly, each driving circuit D1-D3 includes an output buffer BF1-BF3, respectively. In order to synchronize the output driving signals S1-S3, the data or clock signal should be received by the output buffers BF1-BF3 at the same time. Therefore, several replica receivers and/or replica transmitters may be implemented in conjunction with the original receivers and transmitters. In detail, the driving circuit D3 includes a receiver RX3A and a transmitter TX3A. The driving circuit D2 includes a replica receiver RX2B in addition to a receiver RX2A and a transmitter TX2A. The driving circuit D1 includes two replica receivers RX1B and RX1C and a replica transmitter TX1B in addition to a receiver RX1A and a transmitter TX1A. As a result, the data or clock signal from the input terminal of the driving circuit D1 may reach each of the output buffers BF1-BF3 after passing through three receivers and two transmitters, to be received by the output buffers BF1-BF3 at the same time (i.e., with the same delay time).

In addition, the driving circuit D1 may further include a dummy transmitter TX1C, the driving circuit D2 may further include a dummy receiver RX2C and dummy transmitters TX2B and TX2C, and/or the driving circuit D3 may further include dummy receivers RX3B and RX3C and dummy transmitters TX3B and TX3C. These dummy transmitters and receivers may be selectively disposed, so as to achieve identical output loading in each driving circuit D1-D3, to improve the uniformity of delay time.

In an embodiment, each driving circuit may have an identical transceiver implementation with the same number of receivers and transmitters, where at least one multiplexer (MUX) may be deployed and controlled based on the position of the driving circuit (e.g., to achieve the signal path as shown in FIG. 2 or FIG. 3), so as to allow the signals to be output by the driving circuits with the same delay time.

In other words, with the configuration of the MUX(s), the signals of the driving circuits may be output to the controller after passing through the same number of receivers (including replica receivers) and the same number of transmitters (including replica transmitters).

In another embodiment, the driving circuits are synchronized using a delay frame start scheme. In a control system where a controller is controlled by multiple driving circuits coupled in series, each driving circuit may output a flag signal after the data or clock signal is completely received by the driving circuit. As for an application of display panel, the flag signal may be regarded as a frame start signal indicating the start of displaying a frame of image. The delay time between each driving circuit may be monitored based on the output time of the flag signal. Without any synchronization operation, a flag signal of a driving circuit in the former stage may be output earlier, and a flag signal of a driving circuit in the latter stage may be output later. The time difference of outputting the flag signals stands for the delay time between the two driving circuits. According to the delay frame start scheme, the flag signal may be output by selecting different delay times for different driving circuits to perform synchronization on the flag signal, allowing the driving signals of the driving circuits to be output at the same time.

Figure 4:
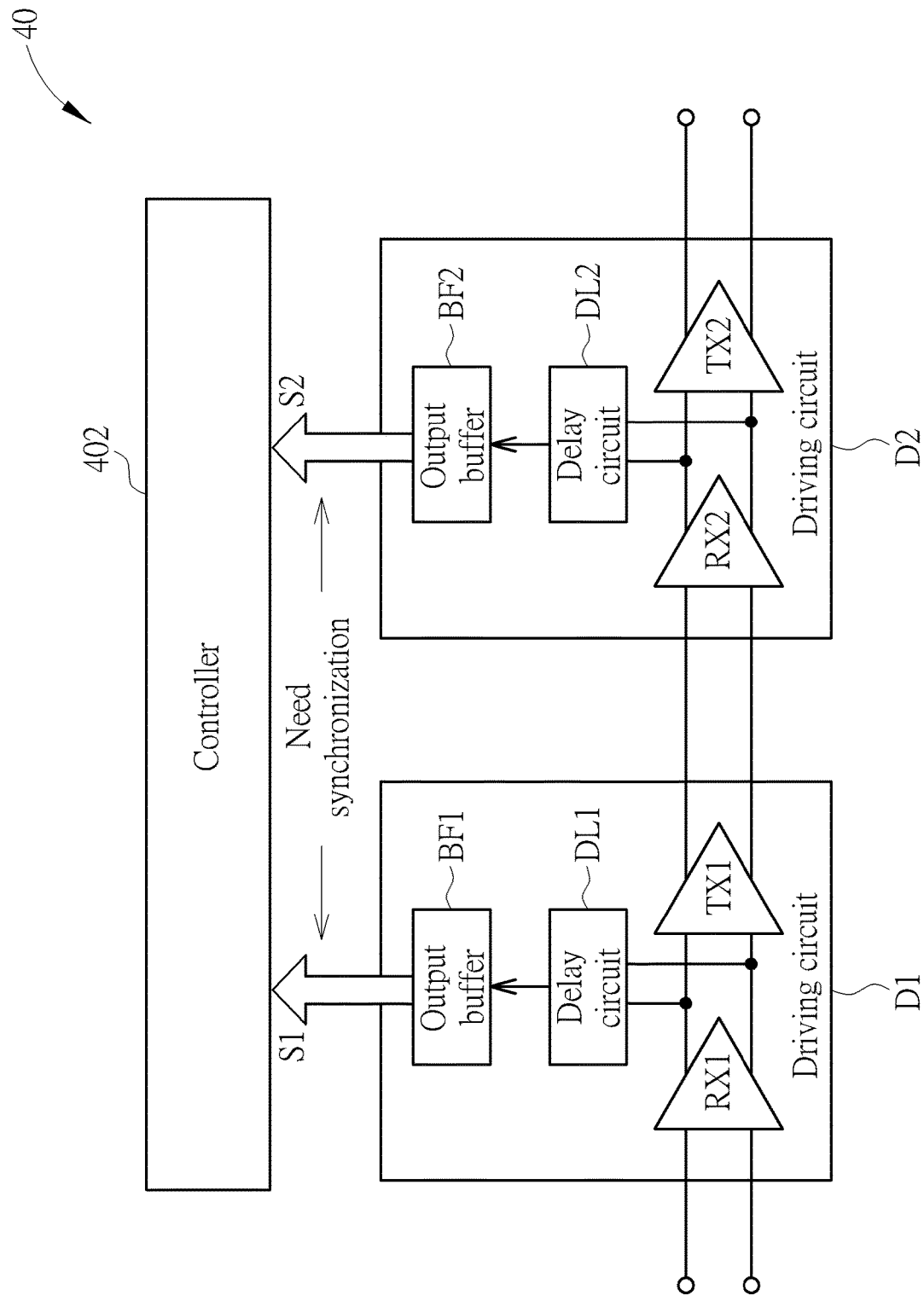

Please refer to FIG. 4, which is a schematic diagram of a further control system 40 according to an embodiment of the present invention. As shown in FIG. 4, the control system 40 includes a controller 402 and two driving circuits D1 and D2. The controller 402 may receive driving signals S1 and S2 from the driving circuits D1 and D2, respectively. The driving circuits D1 and D2 may be two of a plurality of driving circuits coupled in series included in the control system 40, where the driving circuit D1 may receive a data or clock signal from the signal source or a driving circuit in the previous stage, and forward the data or clock signal to the driving circuit D2. Similarly, the driving circuit D1 includes a receiver RX1, a transmitter TX1 and an output buffer BF1, and the driving circuit D2 includes a receiver RX2, a transmitter TX2 and an output buffer BF2. The receiver RX2 of the driving circuit D2 is coupled to the transmitter TX1 of the driving circuit D1, allowing the driving circuit D2 to receive the data or clock signal from the driving circuit D1.

In the control system 40, the driving circuit D1 may further include a delay circuit DL1, which is coupled between the receiver RX1, the transmitter TX1 and the output buffer BF1. The driving circuit D2 may further include a delay circuit DL2, which is coupled between the receiver RX2, the transmitter TX2 and the output buffer BF2. As mentioned above, the output time of the flag signal needs to be synchronized; hence, a delay time maybe generated in the delay circuits DL1 and DL2, and the length of the delay time should be configurable and adjustable, in order to achieve the synchronization between the driving circuits D1 and D2.

Figure 5:
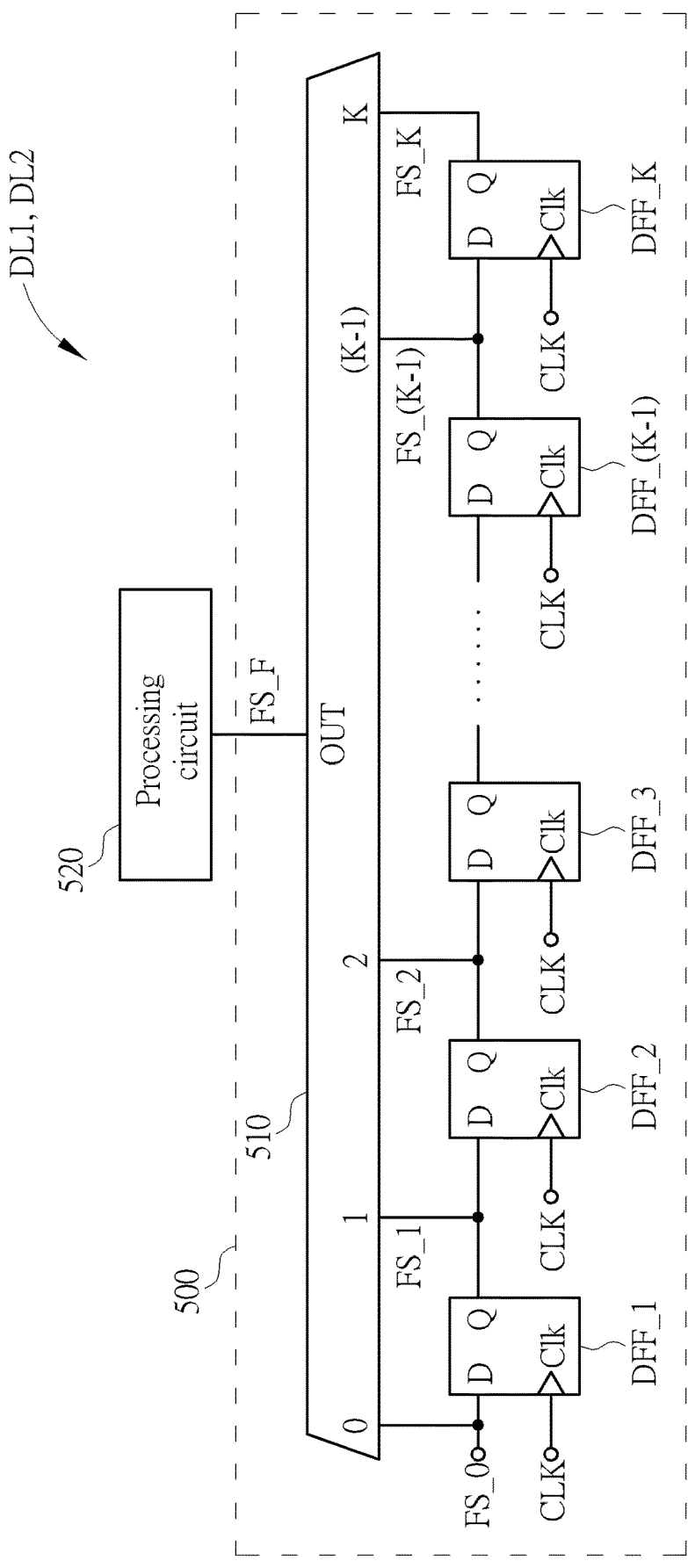
FIG. 5 and FIG. 6 illustrate exemplary implementations of the delay circuit shown in FIG. 4.

Please note that the delay circuits maybe realized in various manners. In an embodiment, each of the delay circuits DL1 and DL2 may include a flag signal selector for outputting the flag signal with a selected delay time. FIG. 5 illustrates an exemplary implementation of the delay circuit DL1 or DL2 shown in FIG. 4. As shown in FIG. 5, the delay circuit DL1 or DL2 may include a flag signal selector 500 and a processing circuit 520. The flag signal selector 500 includes a select circuit 510 and a plurality of D flip-flops DFF_1-DFF_K, where K may be any positive integer greater than 1. The select circuit 510 may be a MUX, where the plurality of D flip-flops DFF_1-DFF_K are respectively coupled to the input terminals of the select circuit 510, and the processing circuit 520 is coupled to the output terminal of the select circuit 510. The select circuit 510 may further include a select terminal (not illustrated), which controls the select circuit 510 to selectively output the final flag signal FS_F to the processing circuit 520 from one of the D flip-flops DFF_1-DFF_K.

In detail, the processing circuit 520 is configured to process the data or clock signal received by the corresponding driving circuit D1 or D2, and then output the corresponding driving signal to the output buffer BF1 or BF2. In an embodiment, the processing circuit 520 may start to process the data or clock signal when receiving the final flag signal FS_F from the flag signal selector 500, where the final flag signal FS_F is selected from the flag signals FS_0-FS_K. Based on selection of the flag signal selector 500, the processing circuit 520 may receive the final flag signal FS_F with a specific delay time.

As shown in FIG. 5, the D flip-flops DFF_1-DFF_K are connected in series. More specifically, the data input terminal of the D flip-flop DFF_1 in the first stage is configured to receive an original flag signal FS_0, and the data input terminal of each of other D flip-flops DFF_2-DFF_K is coupled to the data output terminal of the D flip-flop in the previous stage. The clock terminal of each D flip-flop DFF_1-DFF_K receives a clock signal CLK. Therefore, each stage of the D flip-flop DFF_1-DFF_K may generate a delay time equal to one clock cycle. The D flip-flop in former stages (such as DFF_1, DFF_2) may provide the flag signal earlier, while the D flip-flop in latter stages (such as DFF_(K−1), DFF_K) may provide the flag signal later. Therefore, the flag signals FS_0, FS_1 . . . FS_K are sequentially output to the select circuit 510 with different delay times, where each flag signal is delayed from its previous stage with one clock cycle.

In such a situation, as for different driving circuits, the select circuit 510 may output the final flag signal FS_F having different delays selected from different D flip-flops DFF_1-DFF_K, to synchronize the driving signals output by the driving circuits. In the embodiment as shown in FIG. 5, in the driving circuit D1 in the former stage, the data or clock signal may be received with less delay time; hence, the select circuit 510 may select the final flag signal FS_F from a D flip-flop having more delay time as compensation. In the driving circuit D2 in the latter stage, the data or clock signal may be received with more delay time; hence, the select circuit 510 may select the final flag signal FS_F from a D flip-flop having less delay time. In this manner, the processing circuit 520 of different driving circuits may receive the final flag signal FS_F simultaneously, and thereby start to process the received data or clock signal simultaneously. Therefore, the output buffers BF1 and BF2 may also receive the corresponding signals simultaneously, and thereby output the driving signals at the same time. As a result, the driving signal S1 output by the driving circuit D1 and the driving signal S2 output by the driving circuit D2 may be synchronized with each other.

Figure 6:
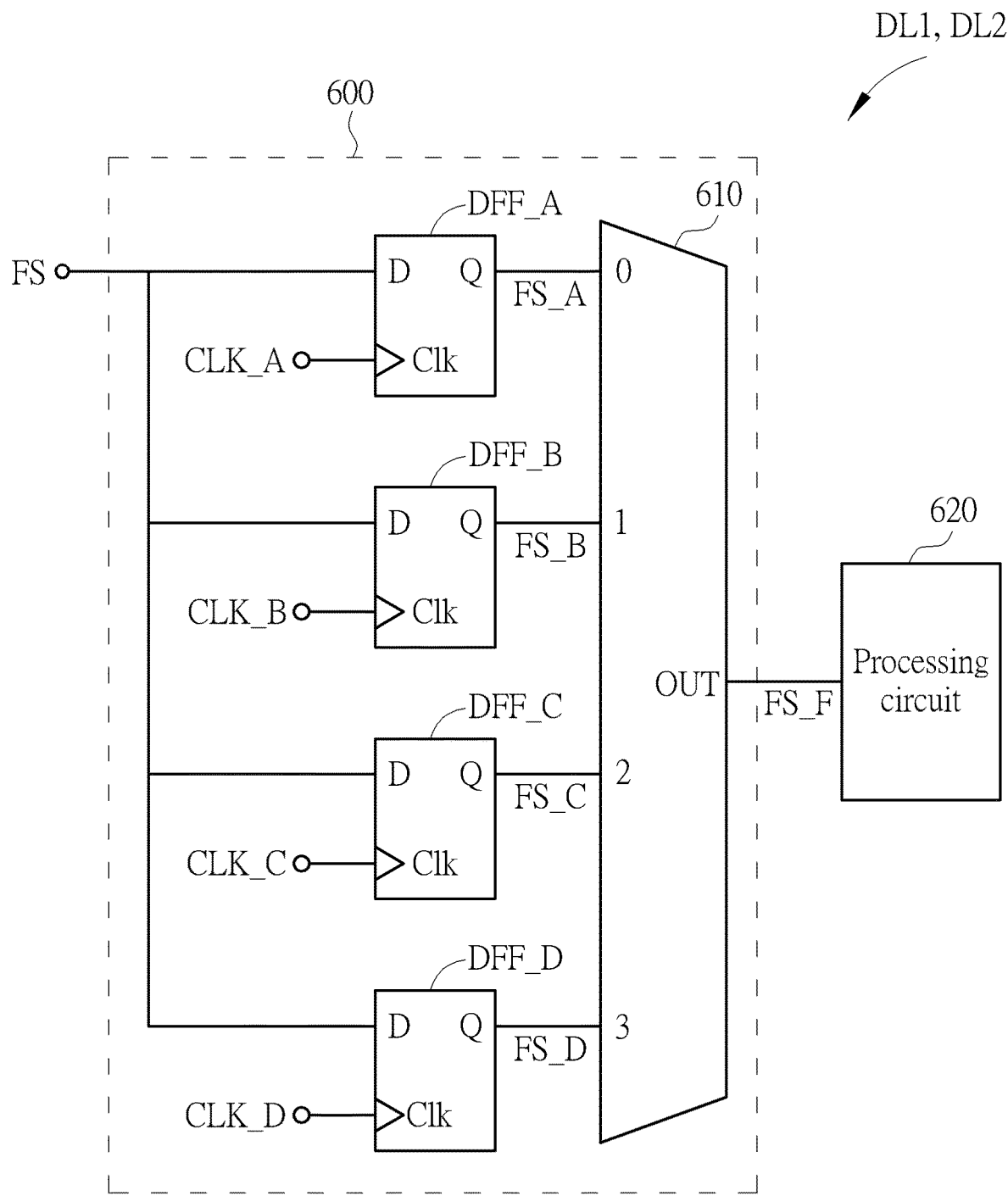

In the above embodiment, the delay time adjustment of the delay circuit DL1 or DL2 may be performed based on a resolution equal to one cycle time of the clock signal CLK. In another embodiment, the delay time less than one clock cycle may be achieved. FIG. 6 illustrates another exemplary implementation of the delay circuit DL1 or DL2 shown in FIG. 4. As shown in FIG. 6, the delay circuit DL1 or DL2 may include a flag signal selector 600 and a processing circuit 620. The flag signal selector 600 includes a select circuit 610 and four D flip-flops DFF_A-DFF_D. The select circuit 610 may be a MUX, where the D flip-flops DFF_A-DFF_D are respectively coupled to the input terminals of the select circuit 610, and the processing circuit 620 is coupled to the output terminal of the select circuit 610. The select circuit 610 thereby outputs the final flag signal FS_F to the processing circuit 620, where the final flag signal FS_F is selected from the flag signals FS_A-FS_D, each output by one of the D flip-flops DFF_A-DFF_D.

Figure 7:
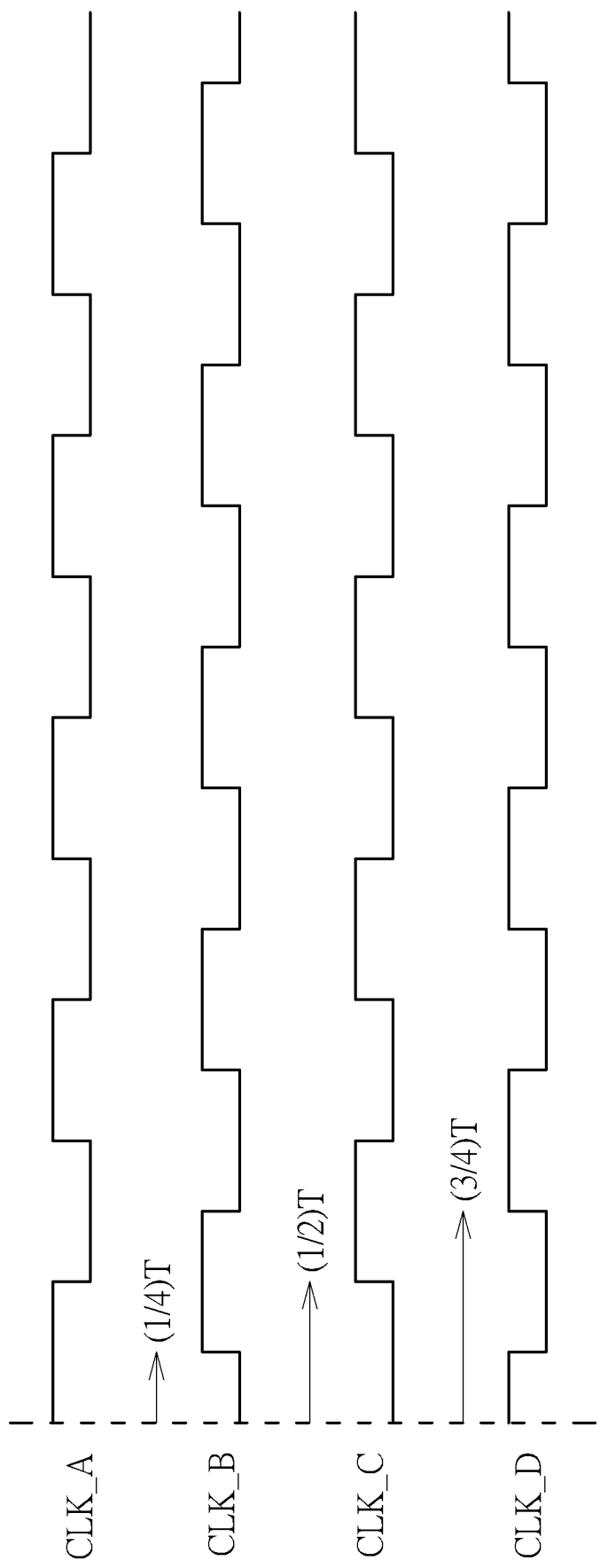
FIG. 7 is a waveform diagram illustrating the waveforms of the clock signals.

In order to achieve higher delay resolution, the D flip-flops DFF_A-DFF_D may receive clock signals CLK_A-CLK_D having different phases. FIG. 7 is a waveform diagram illustrating the waveforms of the clock signals CLK_A, CLK_B, CLK_C and CLK_D. As shown in FIG. 7, compared to the clock signal CLK_A, the clock signal CLK_B has a delay time equal to ¼ cycle, the clock signal CLK_C has a delay time equal to ½ cycle, and the clock signal CLK_D has a delay time equal to ¾ cycle. As a result, as compared to the flag signal FS_A output by the D flip-flop DFF_A, the flag signal FS_B output by the D flip-flop DFF_B has a delay time (¼)T, the flag signal FS_C output by the D flip-flop DFF_C has a delay time (½)T, and the flag signal FS_D output by the D flip-flop DFF_D has a delay time (¾)T, where T refers to one clock cycle. The select circuit 610 may output the final flag signal FS_F which may be selected from different D flip-flops DFF_A-DFF_D to introduce different delay times, so as to synchronize the driving signals S1 and S2 output by the driving circuits D1 and D2.

In the above embodiments, different delay times are generated by connecting multiple D flip-flops in parallel. Note that the implementations of the delay circuit of the present invention are not limited thereto. For example, the delay times may be generated by using any other type of flip-flops or any other delay circuit.

In an embodiment, the flag signal FS of the driving circuits D1 and D2 may be output to a monitor, and a user or an operator may adjust the configurations of the flag signal selector 500 or 600 accordingly. For example, the information of the flag signal FS may be shown on a display panel included in the controller, or a display device externally coupled to the driving circuits. In a test procedure of the control system, the operator may control the delay circuits DL1 and DL2 of each driving circuit D1 and D2 to have the same configuration and monitor the flag signal FS of each driving circuit D1 and D2, in order to determine the length of delay time between each driving circuit D1 and D2. Therefore, based on the monitored flag signal FS, the operator may determine that the flag signal selector 500 or 600 of the delay circuits DL1 and DL2 should be configured to select the flag signal FS from which D flip-flop and configure the flag signal selector 500 or 600 accordingly, so that the driving signals S1 and S2 of the driving circuits D1 and D2 may be output at the same time. After the configuration or adjustment of the flag signal selector is completed, the driving signals S1 and S2 will be output with well synchronization in the operation of the control system.

In another embodiment, the controller 402 may be configured to monitor the flag signal FS or the output driving signals S1 and S2 of the driving circuits D1 and D2, and thereby output a control signal to adjust the configurations of the flag signal selector 500 or 600 in the delay circuits DL1 and DL2. For example, as mentioned above, the processing circuit 520 or 620 of the delay circuits DL1 and DL2 may start to process the data or clock signal to allow the output buffer BF1 or BF2 to output the driving signal S1 or S2 when the processing circuit 520 or 620 receives the final flag signal FS_F; hence, the controller 402 may monitor the reception time of the driving signals S1 and S2 to determine their reception time difference. Therefore, based on the detected time difference, the controller 402 may determine that the flag signal selector 500 or 600 of the delay circuits DL1 and DL2 should be configured to select the flag signal FS from which D flip-flop and configure the flag signal selector 500 or 600 accordingly, so that the driving signals S1 and S2 of the driving circuits D1 and D2 may be output at the same time.

Figure 8:
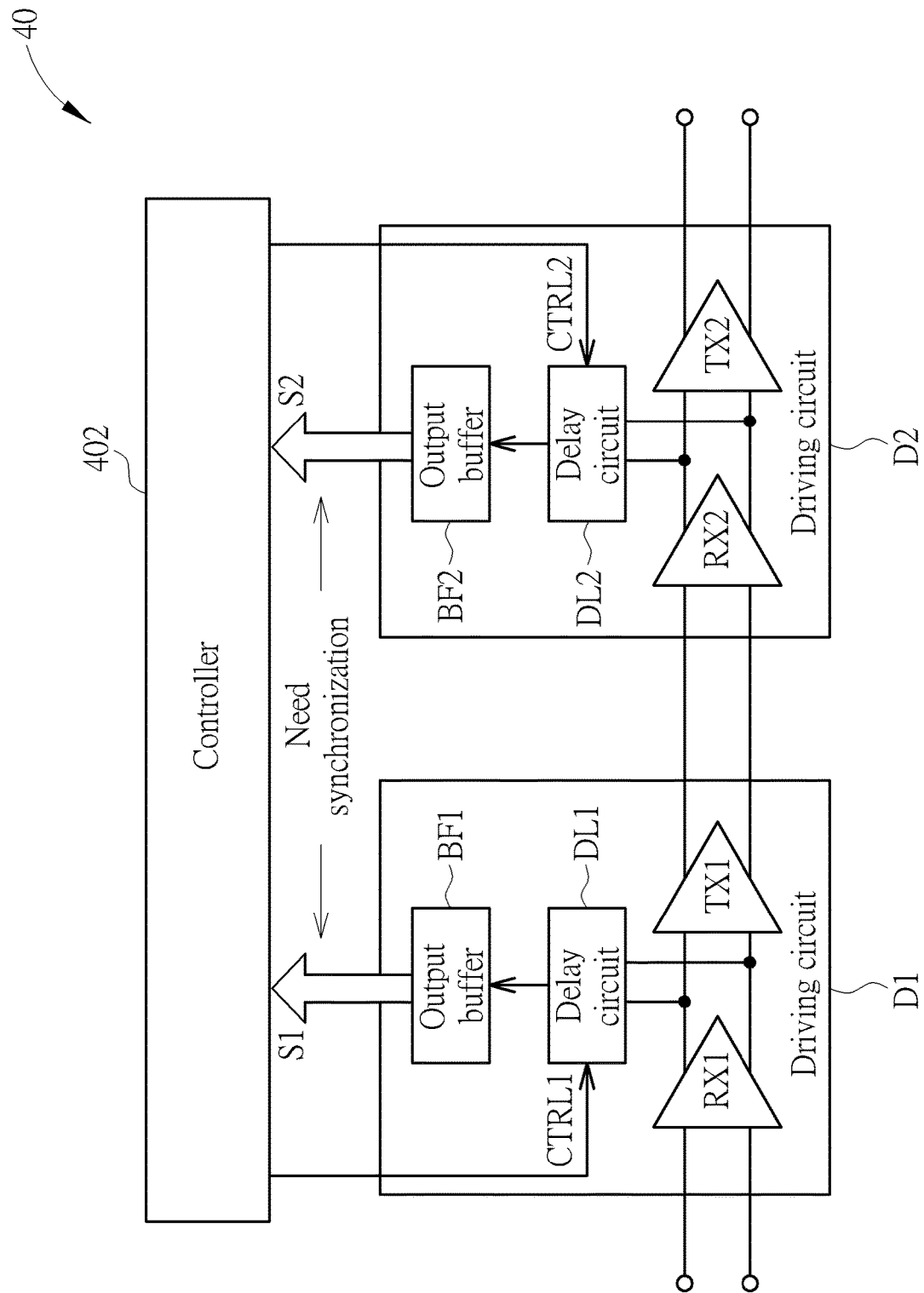
FIG. 8 is a schematic diagram of a control system according to an embodiment of the present invention.

In an embodiment, the controller 402 may be coupled to the delay circuits DL1 and DL2, as shown in FIG. 8, where the controller 402 may send control signals CTRL1 and CTRL2 to control the select circuits (e.g., MUXs) of the delay circuits DL1 and DL2. The control signals CTRL1 and CTRL2 may be sent to the select terminal of the select circuit, to configure the select circuit to output the final flag signal FS_F from the selected D flip-flop. In another embodiment, the controller 402 may be coupled to the input terminal of the receivers RX1 and RX2, and the control signals may be forwarded to the delay circuits DL1 and DL2 through reception of the receivers RX1 and RX2.

Please note that the present invention aims at providing a method of synchronizing cascade driving circuits in a control system. Those skilled in the art may make modifications and alterations accordingly. For example, in the embodiments of the present invention, both the delay replica scheme and the delay frame start scheme are applicable to the control system having any number of driving circuits. In addition, the signals forwarded between the driving circuits may include data signals, clock signals, and/or control signals for realizing various functions, and may be forwarded in form of electronic, optic, magnetic, sonic, or any other possible manners. Further, in the delay frame start scheme, the delay time to be configured in the flag signal selector may be adjusted to any appropriate value. In an embodiment, the delay time adjustment based on the clock cycle (as shown in FIG. 5) and the delay time adjustment based on the clock phase (as shown in FIG. 6) maybe cooperated, and/or the delay replica scheme and the delay frame start scheme may be cooperated.

Figure 9:
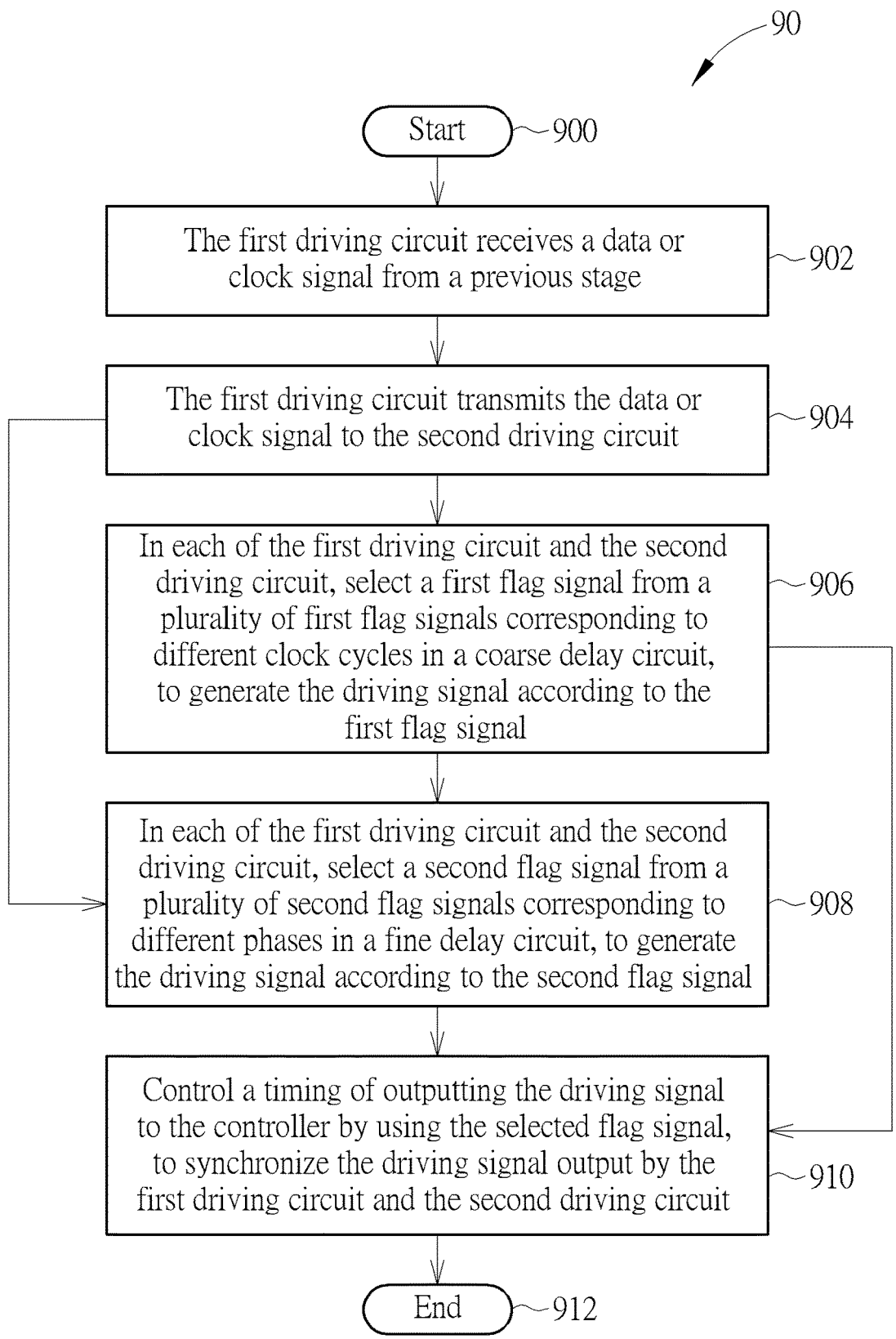
FIG. 9 is a flowchart of a synchronization process according to an embodiment of the present invention.

Please refer to FIG. 9, which is a flowchart of a synchronization process 90 according to an embodiment of the present invention. As shown in FIG. 9, the synchronization process 90 may be implemented in a control circuit of the present invention, to synchronize a first driving circuit with a second driving circuit of the control circuit, where both of the first driving circuit and the second driving circuit are configured to control a controller. The synchronization process 90 includes the following steps:

Step 900: Start.

Step 902: The first driving circuit receives a data or clock signal from a previous stage.

Step 904: The first driving circuit transmits the data or clock signal to the second driving circuit.

Step 906: In each of the first driving circuit and the second driving circuit, select a first flag signal from a plurality of first flag signals corresponding to different clock cycles in a coarse delay circuit, to generate the driving signal according to the first flag signal.

Step 908: In each of the first driving circuit and the second driving circuit, select a second flag signal from a plurality of second flag signals corresponding to different phases in a fine delay circuit, to generate the driving signal according to the second flag signal.

Step 910: Control a timing of outputting the driving signal to the controller by using the selected flag signal, to synchronize the driving signal output by the first driving circuit and the second driving circuit.

Step 912: End.

According to the synchronization process 90, the first driving circuit receives the data or clock signal from a previous stage and forwards the data or clock signal to the second driving circuit; hence, the first driving circuit may be regarded as the driving circuit D1 and the second driving circuit may be regarded as the driving circuit D2 as in the above embodiments. In the driving circuits D1 and D2, the coarse delay circuit is applied to perform coarse delay adjustment on the data or clock signal to generate the driving signal, and the fine delay circuit is applied to perform fine delay adjustment on the driving signal, so as to synchronize the driving signals output by the driving circuits D1 and D2.

The coarse delay circuit may use the delay frame start scheme as described above. If the delay frame start scheme is applied, the coarse delay circuit may include a flag signal selector as shown in FIG. 5, where a flag signal is selected from a plurality of flag signals corresponding to different clock cycles, so as to synchronize the data or clock signal of the driving circuits D1 and D2 by selecting different flag signals corresponding to different clock cycles for the driving circuits D1 and D2. For example, the flag signal FS_2 may be selected in the driving circuit D1 and the flag signal FS_1 may be selected in the driving circuit D2, and thus different delay times are provided for synchronization.

Alternatively, the coarse delay circuit may use the delay replica scheme, where the coarse delay circuit may include a replica receiver, and the data or clock signal in the driving circuit D1 may pass through the replica receiver to generate an intentional delay time as identical to the delay time generated by the receiver of the driving circuit D2.

The fine delay circuit may use clock phase selection of the delay frame start scheme to realize fine tune of the delay time. In detail, the fine delay circuit may include a flag signal selector as shown in FIG. 6, which is configured to synchronize the driving signal of the driving circuits D1 and D2 by selecting different flag signals corresponding to different clock phases for the driving circuits D1 and D2. For example, the flag signal FS_B maybe selected in the driving circuit D1 and the flag signal FS_A may be selected in the driving circuit D2, and thus different delay times are provided for synchronization.

Please note that although the synchronization process 90 performs synchronization on the driving signals output by two driving circuits D1 and D2, the synchronization process 90 may also be applicable to synchronize more than two driving circuits coupled in series (i.e., cascade driving circuits). The detailed implementations may be easily inferred by those skilled in the art, and will not be narrated herein.

Please also note that the synchronization process 90 having the coarse delay and fine delay operations is merely an exemplary embodiment. Alternatively, only one of the coarse delay and fine delay operations is performed, and similar synchronization effects may be achieved. In an embodiment, Step 906 may be omitted and the fine delay of Step 908 is performed after Step 904; or Step 908 may be omitted and the coarse delay of Step 906 is performed and followed by Step 910, as shown in FIG. 9.

To sum up, the present invention provides a method of synchronizing cascade driving circuits in a control system, wherein the cascade driving circuits are configured to drive or control the same controller to realize a predetermined function such as controlling a display panel to show an image. Since the driving circuits are coupled in series, each driving circuit receives a data or clock signal from its previous stage and forwards the data or clock signal to its next stage. The driving signals output by these driving circuits should be well synchronized, to eliminate the time difference between the output driving signals. In an embodiment, the synchronization is performed based on the delay replica scheme, where a replica receiver may be disposed in the driving circuit in the former stage, to generate an intentional delay time identical to the delay time generated by the receiver in the driving circuit in the latter stage. In an embodiment, the synchronization is performed based on the delay frame start scheme, where flag signals may be output by selecting different delay times for different driving circuits, allowing the driving signals of the driving circuits to be output at the same time. The configured delay times of the delay circuit for different driving circuits may be different, as a compensation for the delay of signals forwarded between the cascade driving circuits. In an embodiment, each driving circuit may be an IC included in a chip. As a result, the synchronization schemes may be feasible in a multi-chip system, to realize chip-to-chip synchronization effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control system, comprising:
   a plurality of driving circuits coupled in series, comprising:
     a first driving circuit, comprising:
       a first receiver;
       a first transmitter, coupled to the first receiver; and
       a first flag signal selector, coupled between the first receiver and the first transmitter; and
     a second driving circuit, coupled to the first driving circuit, comprising:
       a second receiver;
       a second transmitter, coupled to the second receiver; and
       a second flag signal selector, coupled between the second receiver and the second transmitter;
   wherein each of the first flag signal selector and the second flag signal selector comprises:
     a select circuit, comprising a plurality of input terminals, an output terminal and a select terminal; and
     a plurality of flip-flops, each coupled to one of the plurality of input terminals of the select circuit;
   wherein the plurality of flip-flops are configured to receive a plurality of clock signals having different phases, respectively.

2. The control system of claim 1, further comprising:
   a controller, coupled to the first driving circuit and the second driving circuit, configured to receive a first driving signal from the first driving circuit and receive a second driving signal from the second driving circuit.

3. The control system of claim 1, wherein the select circuit is configured to selectively output a flag signal from one of the plurality of flip-flops, to synchronize a first driving signal output by the first driving circuit with a second driving signal output by the second driving circuit.

4. A driving circuit, comprising:
   a receiver;
   a transmitter, coupled to the receiver; and
   a flag signal selector, coupled between the receiver and the transmitter;
   wherein the flag signal selector comprises a select circuit coupled to output terminals of a plurality of flip-flops;
   wherein the plurality of flip-flops are configured to receive a plurality of clock signals having different phases, respectively.

5. The driving circuit of claim 4, wherein the select circuit is configured to selectively output a flag signal from one of the plurality of flip-flops, to synchronize output timing of a driving signal output by the driving circuit.

6. A method of driving a controller for a control system having a plurality of driving circuits coupled in series, the plurality of driving circuits comprising a first driving circuit and a second driving circuit, the method comprising:
   receiving, by the first driving circuit, a first signal from a previous stage;
   transmitting, by the first driving circuit, the first signal to the second driving circuit;
   delaying the first signal to generate a second signal according to a flag signal by performing at least one of the following steps:
     selecting a first flag signal from a plurality of first flag signals corresponding to different clock cycles in each of the first driving circuit and the second driving circuit; and
     selecting a second flag signal from a plurality of second flag signals corresponding to different phases in each of the first driving circuit and the second driving circuit; and
   controlling a timing of outputting the second signal to the controller by using at least one of the first flag signal and the second flag signal, to synchronize the second signal output by the first driving circuit and the second driving circuit.

7. The method of claim 6, wherein the step of selecting the first flag signal is implemented in a coarse delay circuit for providing coarse delay adjustment on the first signal, and the step of selecting the second flag signal is implemented in a fine delay circuit for providing fine delay adjustment on the first signal.

8. The method of claim 7, wherein the coarse delay circuit is configured to synchronize the second signal of the first driving circuit and the second driving circuit by selecting different first flag signals corresponding to different clock cycles for the first driving circuit and the second driving circuit.

9. The method of claim 7, wherein the fine delay circuit is configured to synchronize the second signal of the first driving circuit and the second driving circuit by selecting different second flag signals corresponding to different clock phases for the first driving circuit and the second driving circuit.

* * * * *